(12) United States Patent
Duan et al.

(10) Patent No.: US 7,578,423 B1
(45) Date of Patent: Aug. 25, 2009

(54) ASSEMBLY FOR REDUCING OXIDATION OF SEMICONDUCTOR DEVICES

(75) Inventors: Rong Duan, Singapore (SG); Zhao Ya Rui, Singapore (SG); Pei Bei Xu, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 0 days.

(21) Appl. No.: 12/134,404

(22) Filed: Jun. 6, 2008

(51) Int. Cl.
*B23K 37/04* (2006.01)
(52) U.S. Cl. ............... 228/44.7; 228/42; 228/49.5
(58) Field of Classification Search ............... None
See application file for complete search history.

(56) References Cited

U.S. PATENT DOCUMENTS

| | | | | |
|---|---|---|---|---|
| 4,583,676 A * | 4/1986 | Pena et al. | | 228/180.5 |
| 4,938,834 A * | 7/1990 | Yamamoto et al. | | 156/382 |
| 5,162,068 A * | 11/1992 | Yamamoto et al. | | 156/285 |
| 5,272,800 A * | 12/1993 | Rooney et al. | | 29/428 |
| 5,307,978 A * | 5/1994 | Ricketson et al. | | 228/4.5 |
| 5,322,207 A * | 6/1994 | Fogal et al. | | 228/180.5 |
| 5,372,972 A * | 12/1994 | Hayashi et al. | | 29/827 |
| 5,431,329 A * | 7/1995 | Hasegawa et al. | | 228/180.5 |
| 5,622,304 A * | 4/1997 | Sato | | 228/44.7 |
| 5,796,161 A * | 8/1998 | Moon | | 257/676 |
| 5,823,416 A * | 10/1998 | Haji | | 228/4.5 |
| 6,062,459 A * | 5/2000 | Sabyeying | | 228/4.5 |
| 6,334,566 B1 * | 1/2002 | Ball et al. | | 228/4.5 |
| 6,824,037 B2 * | 11/2004 | Sakai et al. | | 228/4.5 |
| 6,866,182 B2 * | 3/2005 | Wong et al. | | 228/219 |
| 7,103,959 B2 * | 9/2006 | Yeap et al. | | 29/564 |
| 7,134,589 B2 * | 11/2006 | Balon | | 228/4.5 |
| 7,182,793 B2 | 2/2007 | Duan et al. | | |
| 7,303,109 B2 * | 12/2007 | Kwan et al. | | 228/1.1 |
| 2001/0007084 A1 * | 7/2001 | Koo et al. | | 700/117 |
| 2004/0026486 A1 * | 2/2004 | Evers et al. | | 228/212 |
| 2004/0065720 A1 * | 4/2004 | Wong et al. | | 228/219 |
| 2005/0001018 A1 * | 1/2005 | Kwan et al. | | 228/231 |
| 2005/0161488 A1 * | 7/2005 | Duan et al. | | 228/42 |
| 2006/0011701 A1 * | 1/2006 | Duan et al. | | 228/44.7 |
| 2007/0284421 A1 * | 12/2007 | Gillotti et al. | | 228/212 |

FOREIGN PATENT DOCUMENTS

| | | | |
|---|---|---|---|
| JP | 59025232 | | 2/1984 |
| JP | 03225931 A | * | 10/1991 |

* cited by examiner

*Primary Examiner*—Kiley Stoner
(74) *Attorney, Agent, or Firm*—Ostrolenk, Faber, Gerb & Soffen, LLP

(57) ABSTRACT

An assembly for reducing oxidation of a semiconductor device comprises a holding device for securing the semiconductor device to a platform. The holding device includes at least one opening for providing access by a bonding tool to bonding areas where the semiconductor device is to be bonded. A slidable cover covers the holding device and has a slot for providing access by the bonding tool to the bonding areas through the slot. A guiding device is positioned on the slidable cover and is coupled to a pusher which is operative to push the slidable cover to move along a first axis. The pusher is further guided by the guiding device to move relative to the slidable cover along a second axis which is perpendicular to the first axis without pushing the slidable cover to move in the second axis.

14 Claims, 2 Drawing Sheets

ASSEMBLY FOR REDUCING OXIDATION OF SEMICONDUCTOR DEVICES

FIELD OF THE INVENTION

The invention relates to wire bonding, and in particular to an assembly to minimize oxidation of semiconductor devices such as leadframes or other carriers that are made from certain reactive metals during wire bonding.

BACKGROUND AND PRIOR ART

The manufacture of semiconductor packages typically involves the use of substrates such as semiconductor leadframes for mounting integrated circuit chips. Leadframes are commonly made from reactive metals such as iron alloy or copper alloy. Leadframes made from copper alloy are sometimes preferred over iron alloy leadframes due to factors such as better heat dissipation, ease of processing and cost. Nonetheless, the use of copper alloy also has its disadvantages, such as its tendency to oxidize when it reacts with oxygen to produce copper oxide when exposed to oxygen in the air at high temperatures. Such oxidation results in oxygen forming weak bonds with the atoms at the leadframe surface, and a layer of brittle and/or poorly adhering oxides. Thus, oxidation introduces reliability problems for microelectronic packages.

The problem of oxidation is particularly acute during wire bonding in a typical semiconductor packaging process, wherein conductive bonding wires are bonded to contact surfaces on a semiconductor die and a leadframe to establish electrical connections therebetween. This bonding is commonly done by using an ultrasonic transducer to generate mechanical vibration energy with an external pressure force to adhere the wire to the die and leadframe surfaces. However, heat generated during the process may aggravate the oxidation of the leadframe surface, leading to non-stick or unreliability of the bond. Oxidation during the wire bonding process should thus be stopped or at least reduced.

A typical wire bonder uses a window clamp, which is usually rectangular in design, to clamp a leadframe securely to a top plate of a workholder. An industry practice for protecting leadframes from oxidation is to introduce large amounts of a relatively inert gas, usually nitrogen gas, to the leadframe. Various apparatus have been used to do this. In a typical apparatus, an area of the leadframe is covered by the body of the window clamp and is thus relatively well-protected from oxidation, leaving an opening inside the body of the window clamp which leads to a bonding area. The bonding area is exposed to the atmosphere, and is most vulnerable to oxidation.

One method of introducing an inert gas is to locate one or more nozzles next to the bonding area to blow the inert gas into the bonding area. The inert gas in the environment around the bonding area would tend to inhibit oxidation reaction of the leadframe at the high bonding temperatures. In another method, the inert gas can be introduced via channels in the window clamp. U.S. Pat. No. 7,182,793 entitled "System for Reducing Oxidation of Electronic Devices" discloses an example of such a method. An opening of the window clamp is positioned over the leadframe to provide access to the bonding area comprising a die and part of the leadframe. The inert gas enters the bonding area from a gas supply outside the window clamp via gas inlets, conduits and a cavity fabricated in the window clamp. The opening is not covered in order for the bondhead to access the die during wire bonding. Since the size of the opening can be quite large, there is a substantial leakage of inert gas into the atmosphere through the opening, in particular when the bonding area is larger. The leadframe is thus more likely to be exposed to oxygen in the general atmosphere, hence promoting increased oxidation of the leadframe.

Japanese Publication No. JP 59-025232 entitled "Bonding Device" discloses a shielding plate for use in wire bonding, where the shielding plate shields an opening section of a cover that is located over a bonding area of a leadframe. The shielding plate forms a bonding work window allowing access to the bonding area by a wire bonding tool. The shielding plate is mounted such that it is rigidly interlocked with an X-Y table which moves the shielding plate together with movement of a bond head holding the wire bonding tool in both the x and y axes. In this way, leakage of an inert gas from under the cover is confined to the bonding work window and therefore kept to a minimum. While the shielding plate allows bonding to be conducted with minimal loss of the inert gas, moving the shielding plate in more than one axis poses a disadvantage as a large working space must be provided for the movement of the shielding plate both in the x and the y axes. It is therefore necessary to look into ways to reduce the size of a wire bonding apparatus by limiting a range of movement of the shielding plate.

SUMMARY OF THE INVENTION

It is thus an object of this invention to seek to provide an assembly and method to reduce the escape of an inert gas from the bonding area, while reducing the space required for accommodating a mechanism used for limiting such escape of the inert gas.

Accordingly, the invention provides an assembly for reducing oxidation of a semiconductor device, comprising: a holding device for securing the semiconductor device to a platform, including at least one opening in the holding device for providing access by a bonding tool to bonding areas where the semiconductor device is to be bonded; a slidable cover covering the holding device, which has a slot for providing access by the bonding tool to the bonding areas through the slot; a guiding device positioned on the slidable cover; and a pusher coupled to the guiding device which is operative to push the slidable cover to move along a first axis; wherein the pusher is further guided by the guiding device to move relative to the slidable cover along a second axis perpendicular to the first axis without pushing the slidable cover to move in the second axis.

It would be convenient hereinafter to describe the invention in greater detail by reference to the accompanying drawings which illustrate the preferred embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which.

DETAILED DESCRIPTION OF THE PREFERRED EMBODIMENTS OF THE INVENTION

The preferred embodiment of the present invention will be described hereinafter with reference to the accompanying drawings.

Figure 1:
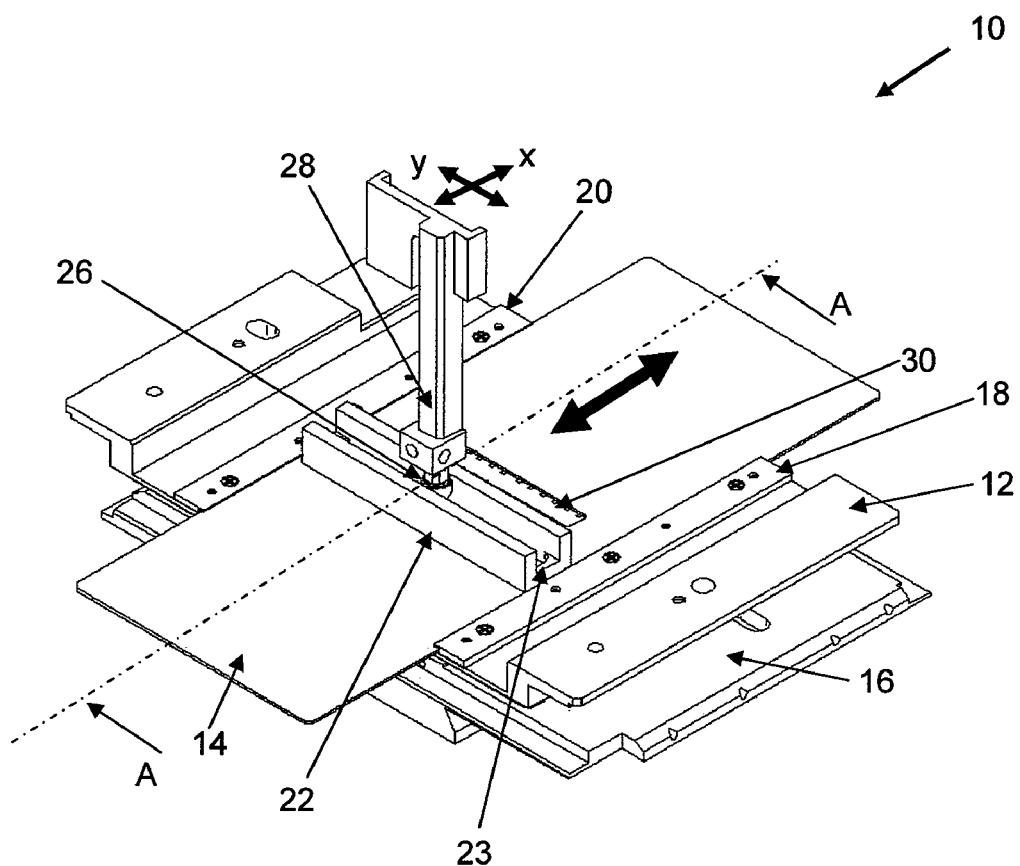
FIG. 1 is an isometric view of a bonding platform incorporating a window clamp with a slidable cover according to the preferred embodiment of the present invention.

FIG. 1 is an isometric view of a bonding platform 10 incorporating a holding device in the form of a window clamp 12 with a slidable cover 14 according to the preferred embodiment of the present invention. The window clamp 12 secures a semiconductor device such as a leadframe substrate onto a platform or top plate 16. The slidable cover 14 covers the top of the window clamp 12 and is aligned and guided to slide by cover guides mounted on the window clamp 12. The cover guides comprise first and second cover guides 18, 20 located on opposite sides of the slidable cover 14. The slidable cover 14 is restrained and guided by the first and second cover guides 18, 20 such that it is movable along a first axis, such as an x axis. A guiding device such as a U-shaped sliding guide 22 is arranged and positioned on the slidable cover 14. The sliding guide 22 is oriented parallel to a second axis which is perpendicular to the first axis, such as a y axis. The U-shaped sliding guide 22 preferably extends substantially from the one side of the slidable cover 14 to an opposite side thereof. A pusher 28 is coupled to the sliding guide 22 by a pusher head 26 located at a distal end of the pusher. The U-shaped sliding guide 22 has a recess 23 to which the pusher head 26 is engaged when it is being guided by the sliding guide 22.

A slot 30 is formed in the slidable cover 14 and it may comprise an elongated opening which extends along the y axis. The slot 30 provides access by a capillary of a bonding tool to a bonding area located below the slidable cover 14 through the slot 30. The pusher 28 and the bonding tool are both connected to a positioning table, preferably an X-Y table, and are configured to move together with the positioning table in the x or y axis. This allows the capillary 32 to access different bonding areas through the slot 30 when the slidable cover 14 is pushed by the pusher 28 in different directions in the x axis.

Figure 2:
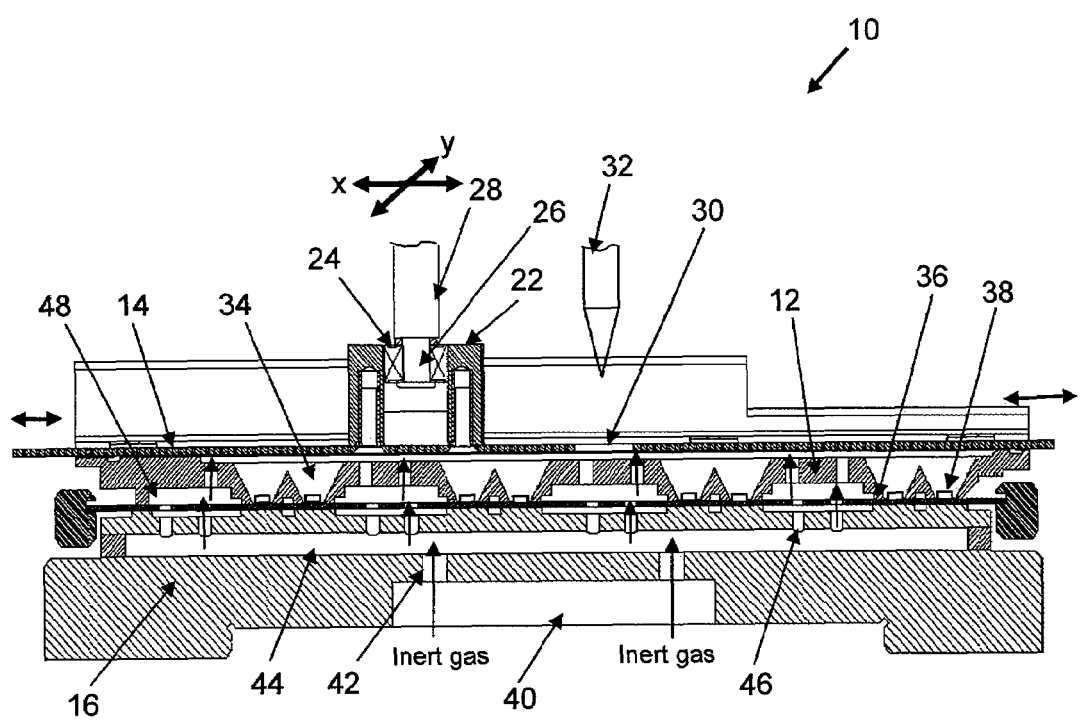
FIG. 2 is a cross-sectional view of the bonding platform seen along sectional line A-A of FIG. 1 which illustrates the introduction of an inert gas to a leadframe that is being wire bonded.

FIG. 2 is a cross-sectional view of the bonding platform 10 seen along sectional line A-A of FIG. 1 which illustrates the introduction of an inert gas to a leadframe 36 that is being wire bonded. The top plate 16 includes heating elements to heat the leadframe 36. The window clamp 12 has at least one opening 34 for providing access by a bonding tool to the bonding areas which include at least a die 38 and part of the leadframe 36 for wire bonding.

The top plate 16 is fabricated with a chamber 40 which receives the inert gas from an external source and transfers the inert gas to multiple gas channels 42, 44, 46 in the top plate 16. The gas channels 42, 44, 46 connect the inert gas flow to air gaps 48 found in the window clamp 12. The air gaps 48 direct inert gas to the openings 34, which are isolated from the ambient air by the slidable cover 14.

The pusher head 26 of the pusher 28 is slidable along the recess 23 of the U-shaped sliding guide 22 and is slidably connected to the side walls of the U-shaped sliding guide 22 by bearings 24. The bearings 24 permit the pusher 28 to slide along the sliding guide 22 in the recess 23 along the y axis between the first and second cover guides 18, 20. Thus, the pusher is operative to push the slidable cover 14 along the x axis and is further guided by the sliding guide 22 to move relative to the slidable cover 14 along the y axis without pushing the slidable cover 14 in the y axis.

Movement of the pusher 28 in the x and y axes is determined by the movement of the X-Y table. Wire bonding is performed row by row on the leadframe 36 along rows of dice 38 that are exposed by the slot 30, each row being aligned with the y axis. After a row of dice 38 are wire-bonded, the pusher 28 moves in the x axis, thereby pushing the slidable cover 14 with it such that the slot 30 is shifted to be located over another row of dice 38 on the leadframe 36. The capillary 32, which is configured to move together with the pusher 28 by the same distance in the x axis, may then access the next row of dice 38 through the slot 30. Wire bonding is then performed for the next exposed row of dice 38.

The slot 30 on the slidable cover 14 has a width which is significantly narrower than the totality of openings 34 comprised in the wire clamp 12. This ensures that the slidable cover 14 substantially encloses the openings 34 for substantially preventing leakage of the inert gas into the ambient atmosphere. This also limits the exposure of the leadframe 36 and dice 38 to the general ambient atmosphere containing oxygen. An environment is therefore maintained in the bonding area which impedes oxidation.

It should be appreciated that the preferred embodiment of the present invention provides an effective way of reducing oxidation of a leadframe being bonded, especially when the bonding area is large. Most of the bonding area is covered by the slidable cover 14 except at the slot 30 where wire bonding is actually performed. This cuts off the plurality of openings 34 of the window clamp 12 where wire bonding is not being performed from the ambient air and limits leakage of inert gas into the atmosphere through the slot 30 only. This maintains a high saturation of inert gas in the window clamp openings 34, thus reducing oxidation and maintaining the non-oxidizing environment.

Consumption of inert gas is lowered since wastage of inert gas is reduced. Furthermore, as the bearings 24 allow the pusher 28 to move along the y axis in the recess 23 without moving the slidable cover 14 in the y axis, space is required only for accommodating the movement of the slidable cover 14 in the x axis when the capillary 32 is wire bonding different bonding areas of the leadframe 36. The space required on the bonding apparatus for accommodating the slidable cover 14 is thus smaller as compared to the aforementioned prior art.

The invention described herein is susceptible to variations, modifications and/or additions other than those specifically described and it is to be understood that the invention includes all such variations, modifications and/or additions which fall within the spirit and scope of the above description.

The invention claimed is:

1. Assembly for reducing oxidation of a semiconductor device, comprising:
   a holding device for securing the semiconductor device to a platform, including at least one opening in the holding device for providing access by a bonding tool to bonding areas where the semiconductor device is to be bonded;
   a slidable cover covering the holding device, which has a slot for providing access by the bonding tool to the bonding areas through the slot;
   a guiding device positioned on the slidable cover; and
   a pusher coupled to the guiding device which is operative to push the slidable cover to move along a first axis;
   wherein the pusher is further guided by the guiding device to move relative to the slidable cover along a second axis perpendicular to the first axis without pushing the slidable cover to move in the second axis.

2. The assembly as claimed in claim 1, further comprising a cover guide mounted on the holding device for guiding the slidable cover for movement along the first axis.

3. The assembly as claimed in claim 2, wherein the cover guide comprises first and second cover guides located on opposite sides of the slidable cover.

4. The assembly as claimed in claim 1, further comprising a pusher head located at a distal end of the pusher for coupling the pusher to the guiding device.

5. The assembly as claimed in claim 4, wherein the guiding device has a recess to which the pusher head is engaged.

6. The assembly as claimed in claim 5, wherein the guiding device is U-shaped.

7. The assembly as claimed in claim 4, wherein the pusher head is slidably connected to side walls of the guiding device by bearings.

8. The assembly as claimed in claim 1, wherein the guiding device extends parallel to the second axis.

9. The assembly as claimed in claim 8, wherein the guiding device extends substantially from one side of the slidable cover to an opposite side thereof.

10. The assembly as claimed in claim 1, wherein the slot is elongated and extends parallel to the second axis.

11. The assembly as claimed in claim 10, wherein a width of the elongated slot is narrower than a totality of openings in the holding device.

12. The assembly as claimed in claim 1, wherein the pusher and the bonding tool are both connected to a positioning table and configured to move together with the positioning table in the first and second axes.

13. The assembly as claimed in claim 12, wherein the positioning table is an X-Y table.

14. The assembly as claimed in claim 1, wherein the slidable cover is operative to substantially enclose the openings for substantially preventing leakage of inert gas into the ambient atmosphere.

* * * * *